(12) United States Patent
Kato et al.

(10) Patent No.: US 9,249,961 B2
(45) Date of Patent: Feb. 2, 2016

(54) LIGHT-EMITTING DEVICE

(71) Applicant: Toyoda Gosei Co., Ltd., Kiyosu-shi, Aichi-ken (JP)

(72) Inventors: Hideaki Kato, Kiyosu (JP); Shota Shimonishi, Kiyosu (JP)

(73) Assignee: TOYOTA GOSEI CO., LTD., Kiyosu-shi, Aichi-ken (JP)

( * ) Notice: Subject to any disclaimer, the term of this patent is extended or adjusted under 35 U.S.C. 154(b) by 321 days.

(21) Appl. No.: 13/756,305

(22) Filed: Jan. 31, 2013

(65) Prior Publication Data

US 2013/0249401 A1 Sep. 26, 2013

(30) Foreign Application Priority Data

Mar. 22, 2012 (JP) ................. 2012-065853

(51) Int. Cl.
| | |
|---|---|
| *F21V 25/10* | (2006.01) |
| *H01H 37/76* | (2006.01) |
| *H05K 1/02* | (2006.01) |
| *F21V 29/00* | (2015.01) |
| *F21Y 101/02* | (2006.01) |
| *F21Y 105/00* | (2006.01) |

(52) U.S. Cl.
CPC .............. *F21V 25/10* (2013.01); *H01H 37/761* (2013.01); *H05K 1/0201* (2013.01);
(Continued)

(58) Field of Classification Search
CPC ........... H01J 61/00; H01J 61/04; H01J 61/10; H01J 61/12; H01J 61/20–61/28; H01J 61/302; H01J 61/305; H01J 61/327; H01J 61/33–61/38; H01J 61/52; H01J 61/523; H01J 61/526; H01J 61/54; H01J 61/545; H01J 61/547; H01J 61/56; H01J 61/70–61/78; H01J 61/80; H01J 61/822; H01J 61/86; H01J 61/92–61/98; H01J 37/073; H01J 37/265; H01J 37/32018; H01J 37/32045; H01J 37/32192; H01J 37/32357; H01J 37/3244; H01J 37/32623; H01J 37/3408; H01J 37/3423; H01J 37/3497; H01J 65/04; H01J 65/042; H01J 65/044; H01J 65/046; H01J 65/048; F21V 25/00; F21V 25/10; F21V 29/004; F21Y 2101/00; F21Y 2101/02; F21Y 2105/001; H01H 37/00; H01H 37/52; H01H 37/761; H05K 1/00; H05K 1/0201; H05K 2201/10106; H05K 2201/10181
USPC ....................................................... 315/112
See application file for complete search history.

(56) References Cited

U.S. PATENT DOCUMENTS

| | | | | |
|---|---|---|---|---|
| 7,808,361 | B1 * | 10/2010 | Yu ................................. | 337/142 |
| 2003/0122650 | A1 * | 7/2003 | Yamamoto et al. ........... | 337/333 |

(Continued)

FOREIGN PATENT DOCUMENTS

| | | |
|---|---|---|
| DE | 102007-0143336 A1 | 10/2008 |
| JP | S 47-10830 U | 5/1971 |

(Continued)

OTHER PUBLICATIONS

Japanese Office Action dated Aug. 5, 2014 with a partial English translation thereof.

*Primary Examiner* — John Poos
*Assistant Examiner* — David Mattison
(74) *Attorney, Agent, or Firm* — McGinn IP Law Group PLLC

(57) ABSTRACT

A light-emitting device includes a substrate having a metal film on a first surface, a light-emitting element mounted on the first surface of the substrate and connected to the metal film, a heat sensitive circuit breaker mounted on the first surface of the substrate and connected to the metal film, a light-proof cover that covers the heat sensitive circuit breaker to block light emitted from the light-emitting element and travelling toward the heat sensitive circuit breaker, and a heat dissipating member formed on a second surface of the substrate to dissipate heat of the substrate, the second surface being opposite to the first surface.

18 Claims, 3 Drawing Sheets

(52) U.S. Cl.
CPC ........... *F21V 29/004* (2013.01); *F21Y 2101/02* (2013.01); *F21Y 2105/001* (2013.01); *H05K 2201/10106* (2013.01); *H05K 2201/10181* (2013.01)

(56) References Cited

U.S. PATENT DOCUMENTS

2010/0231347 A1   9/2010   Knab et al.
2012/0119234 A1*  5/2012   Shioi et al. .................. 257/88

FOREIGN PATENT DOCUMENTS

| JP | S 61-196439 U | 12/1986 |
| JP | 62-46187 Y | 12/1987 |
| JP | H 07-176249 A | 7/1995 |
| JP | H 07-335016 A | 12/1995 |
| JP | 2006-261085 A | 9/2006 |
| JP | 2007-305512 A | 11/2007 |
| JP | 2010-522419 A | 7/2010 |
| JP | 2012-009451 A | 1/2012 |

* cited by examiner

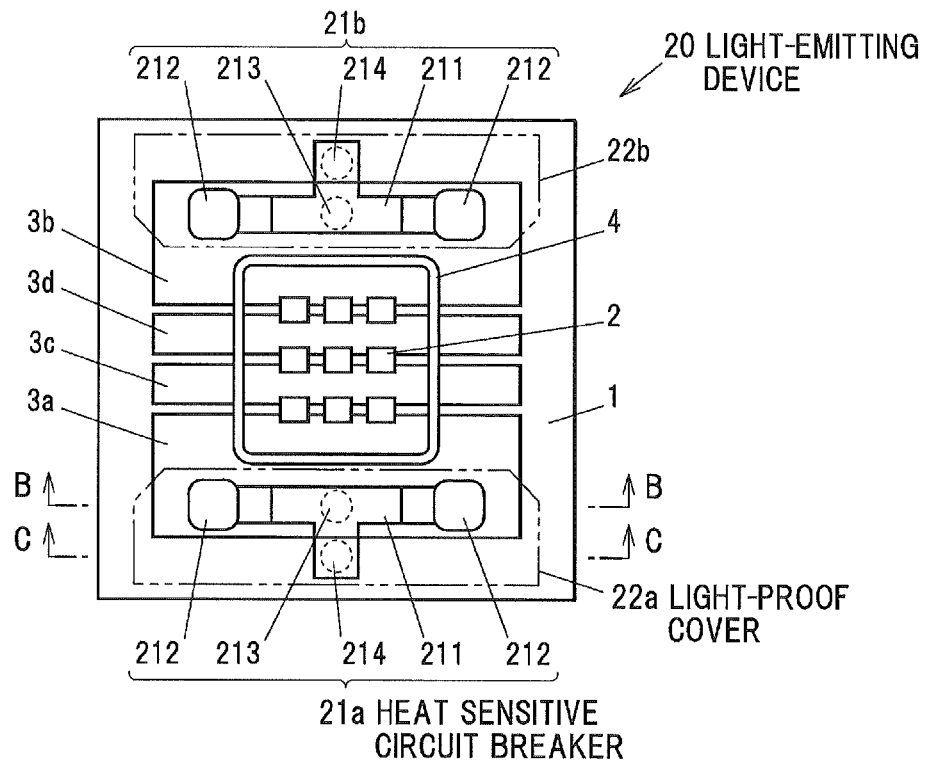
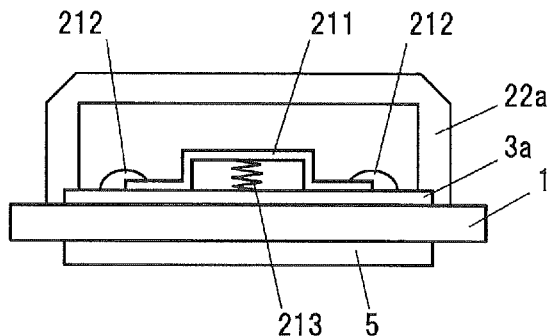
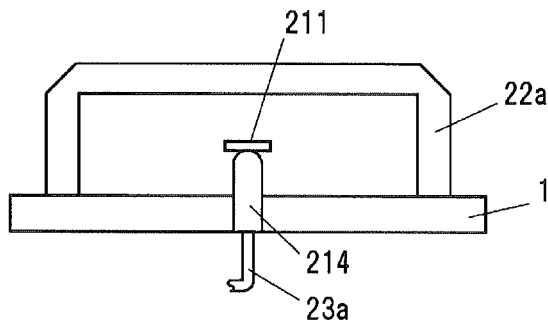

LIGHT-EMITTING DEVICE

The present application is based on Japanese patent application No.2012-065853 filed on Mar. 22, 2012, the entire contents of which are incorporated herein by reference.

BACKGROUND OF THE INVENTION

1. Field of the Invention

The invention relates to a light-emitting device.

2. Related Art

As a conventional light-emitting device, an LED lighting system provided with an LED on a front surface of a printed-circuit board and a thermal fuse on a back surface is known (see, e.g., JP-A-2007-305512).

According to JP-A-2007-305512, when the LED gets stuck in a power-on state due to a malfunction or failure, etc., of a controller of the LED lighting system and temperature of the printed-circuit board reaches a predetermined temperature, the electric current to the LED is interrupted by the thermal fuse to prevent overheat of the LED lighting system and it is thereby possible to improve reliability.

Meanwhile, a conventional thermal fuse which is connected to a circuit by a fuse holder is known (see, e.g., JP-Y-S62-46187 (Utility Model)).

According to JP-Y-S62-46187, after connecting the thermal fuse to a first fuse holder, the first fuse holder is connected to a second fuse holder which is fixed to the substrate, thereby connecting the thermal fuse to the circuit.

SUMMARY OF THE INVENTION

In the LED lighting system described in JP-A-2007-305512, since the fuse is provided on the back surface of the printed-circuit board, an area of a heat dissipating member to be mounted on the back surface of the printed-circuit board is limited. Therefore, a heat dissipation effect by the heat dissipating member may be decreased.

Accordingly, it is an object of the invention to provide a light-emitting device that can improve the reliability of the device and prevent a decrease in the heat dissipation effect by the heat dissipating member while having the thermal fuse.

(1) According to One Embodiment of the Invention, A Light-Emitting Device Comprises:

a substrate having a metal film on a first surface;

a light-emitting element mounted on the first surface of the substrate and connected to the metal film;

a heat sensitive circuit breaker mounted on the first surface of the substrate and connected to the metal film;

a light-proof cover that covers the heat sensitive circuit breaker to block light emitted from the light-emitting element and travelling toward the heat sensitive circuit breaker; and a heat dissipating member formed on a second surface of the substrate to dissipate heat of the substrate, the second surface being opposite to the first surface.

In the above embodiment (1) of the invention, the following modifications and changes can be made.

(i) The heat sensitive circuit breaker is a thermal fuse connected to the metal film via a contact-type connector.

(ii) The heat sensitive circuit breaker comprises a conductive plate in contact with the metal film at both edges and having a convex portion between the both edges so as not to be in contact with the metal film, fusible portions for fixing the both edges of the conductive plate to the metal film, an elastic portion held between the convex portion of the conductive plate and the metal film in a compressed state, and a contact pin in contact with a portion of a bottom surface of the convex portion of the conductive plate.

(iii) The heat sensitive circuit breaker comprises a member that is formed of bimetal or shape-memory alloy and deforms in accordance with temperature variation, and an electrode that is in contact with the member before deformation of the member and is not in contact therewith after the deformation.

(iv) The light-emitting device further comprises a reflector formed around the light-emitting element for reflecting light emitted from the light-emitting element.

(v) The reflector is situated between the light-emitting element and the light-proof cover.

(vi) The reflector comprises a white silicone resin.

(vii) The reflector comprises a same material as the light-proof cover.

Effects of the Invention

According to one embodiment of the invention, a light-emitting device can be provided that can improve the reliability of the device and prevent a decrease in the heat dissipation effect by the heat dissipating member while having the thermal fuse.

BRIEF DESCRIPTION OF THE DRAWINGS

Next, the present invention will be explained in more detail in conjunction with appended drawings, wherein:

FIG. 3 is a top view showing a light-emitting device in a second embodiment;

FIGS. 4A and 4B are vertical cross-sectional views showing the light-emitting device taken on line B-B and line C-C of FIG. 3;

DESCRIPTION OF THE PREFERRED EMBODIMENTS

First Embodiment

Figure 1:
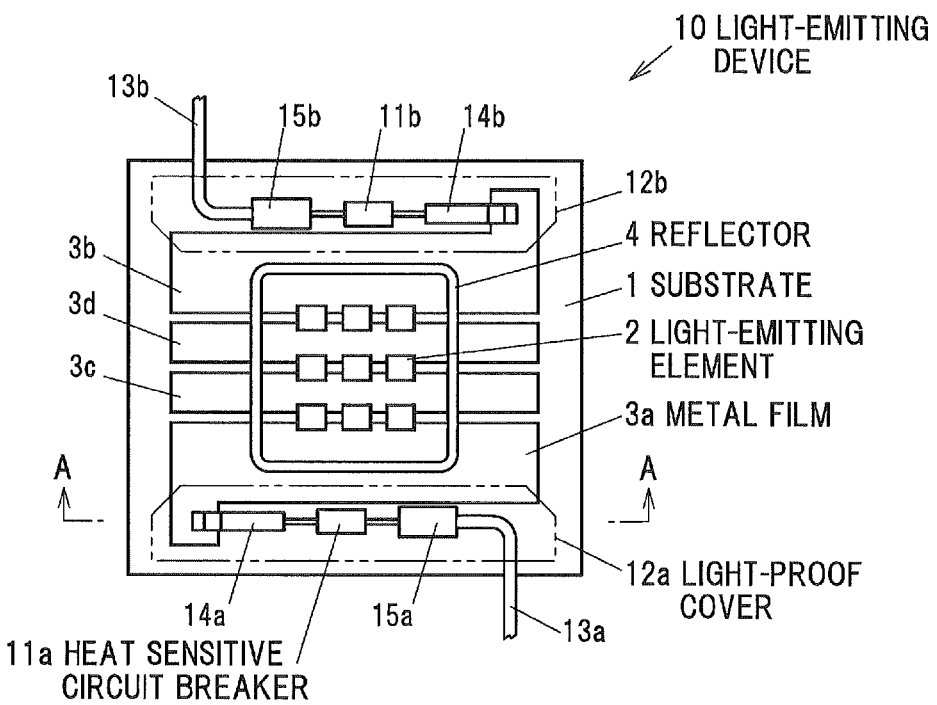
FIG. 1 is a top view showing a light-emitting device in a first embodiment.
Figure 2:
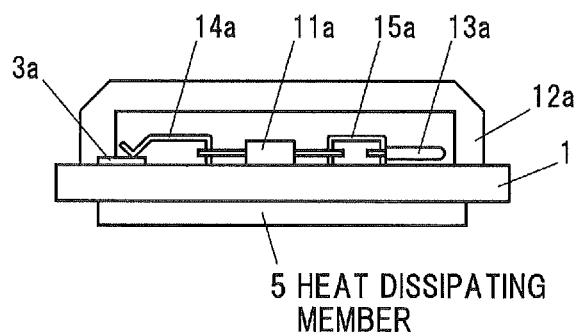
FIG. 2 is a vertical cross-sectional view showing the light-emitting device taken on line A-A of FIG. 1.

FIG. 1 is a top view showing a light-emitting device in a first embodiment. FIG. 2 is a vertical cross-sectional view showing the light-emitting device taken on line A-A of FIG. 1.

A light-emitting device 10 has a substrate 1, a light-emitting element 2 mounted on a first surface of the substrate 1 (on the front face side of the paper of FIG. 1), heat sensitive circuit breakers 11a and 11b mounted on the first surface of the substrate 1, light-proof covers 12a and 12b covering the heat sensitive circuit breakers 11a and 11b to block light emitted from the light-emitting element 2 and travelling toward the heat sensitive circuit breakers 11a and 11b, and a heat dissipating member 5 formed on a second surface of the substrate 1 opposite to the first surface to dissipate heat of the substrate 1. In FIG. 1, illustrations of the light-proof covers 12a and 12b are omitted and contours thereof are shown by a dot-dash-line.

The substrate 1 is, e.g., a ceramic substrate, a resin substrate or a metal core substrate formed by covering a metal plate with an insulation. The substrate 1 has metal films 3 (3a to 3d) with a predetermined pattern on the first surface. In addition, the substrate 1 may have, on the first surface, a passive device such as resistor or capacitor, or an active device/circuit such as current control circuit.

The light-emitting element 2 is, e.g., an LED chip or an EL light-emitting element. The light-emitting element 2 is connected to the metal film 3 through which voltage is applied. In FIG. 1, a flip-chip type LED chip is shown as an example of the light-emitting element 2. The number and layout of the light-emitting elements 2 are not limited to that shown in FIG. 1.

In addition, a reflector 4 for reflecting light emitted from the light-emitting element 2 may be formed around the light-emitting element 2, as shown in FIG. 1. As a material of the reflector 4, it is possible to use a resin such as a white silicone. Plural light-emitting element packages each composed of the light-emitting element 2 and the reflector 4 surrounding therearound may be formed on the substrate 1.

Luminous efficiency of the light-emitting device 10 used for illumination is, e.g., 50 to 150 lm/W, and power consumption thereof when used for illumination at an emission intensity of about 2000 lm is 13 to 40 W. A portion of the power supplied to the light-emitting element 2 or the metal film 3, etc., on the substrate 1 is absorbed as heat by the substrate 1. The heat dissipating member 5 is a member to externally dissipate the heat of the substrate 1, and is, e.g., a metal film pattern, a heatsink, a radiator fin or a heat pipe, etc.

The heat sensitive circuit breakers 11a and 11b sense overheat and interrupt the circuit when the substrate 1 is overheated due to short circuit or failure of circuit components or when the heat dissipating member 5 is unable to sufficiently dissipate heat of the substrate 1 due to failure. In the first embodiment, the heat sensitive circuit breakers 11a and 11b are a thermal fuse in which a fuse element is thermally cut when the temperature of the fuse element inside the fuse rises and exceeds the melting point.

The heat sensitive circuit breakers 11a and 11b are respectively connected to the metal films 3a and 3b via connectors 14a and 14b and are also respectively connected to lead wires 13a and 13b via connectors 15a and 15b.

An electric current supplied from outside flows into the light-emitting device 10 through one of the lead wires 13a and 13b, is supplied to the light-emitting element 2 and then flows out through another of the lead wires 13a and 13b. Therefore, when the substrate 1 is overheated, the circuit is interrupted by the thermal cutting of either the heat sensitive circuit breaker 11a or 11b and power supply to the light-emitting element 2 is cut. Accordingly, it is possible to improve reliability of the light-emitting device 10.

The light-emitting device 10 may have only one of the heat sensitive circuit breakers 11a and 11b. Alternatively, the light-emitting device 10 may have three or more heat sensitive circuit breakers. In addition, the layout of the light-emitting device 10 is not limited to that shown in FIG. 1 as long as the circuit for actuating the light-emitting element 2 is connected onto the first surface of the substrate 1.

Since the connectors 14a, 14b, 15a and 15b are contact-type connectors and the heat sensitive circuit breakers 11a and 11b are connected to the circuit by being fitted to the connectors 14a, 14b, 15a and 15b, soldering is not required for connection to the circuit. Therefore, there is no risk that the heat sensitive circuit breakers 11a and 11b are thermally cut by heat during soldering.

The light-proof covers 12a and 12b are formed of a material having high reflectivity and high temperature resistance in order to block light emitted from the light-emitting element 2 and travelling toward the heat sensitive circuit breakers 11a and 11b, and accordingly, the thermal cutting of the heat sensitive circuit breakers 11a and 11b caused by the light emitted from the light-emitting element 2 is prevented. As a material of the light-proof covers 12a and 12b, it is possible to use a metal or resin material having high reflectivity. As the metal material, it is possible to use, e.g., aluminum, stainless or a copper material plated with silver. As the resin material, it is possible to use polyamide (PA66, PA6 nylon), heat-resistant polyamide resin (PA9T), liquid-crystal polymer (LCP), polyphthalamide (PPA) or saturated polyester, etc. Also, the same resin as that for the reflector 4 may be used. When the metal material is used, it is preferable to apply an insulating resin to a portion requiring insulation or to cover a portion on the heat sensitive circuit breakers 11a, 11b side with an insulating material in order to increase temperature resistance. When the resin material is used, it is possible to provide a thin metal film having a high optical reflectivity on a surface on the light-emitting element 2 side.

Second Embodiment

The second embodiment is different from the first embodiment in the configuration of the heat sensitive circuit breaker. The explanation for the same features as the first embodiment will be omitted or simplified.

FIG. 3 is a top view showing a light-emitting device in a second embodiment. FIGS. 4A and 4B are vertical cross-sectional views showing the light-emitting device taken on line B-B and line C-C of FIG. 3.

A light-emitting device 20 has the substrate 1, the light-emitting element 2 mounted on the first surface of the substrate 1 (on the front face side of the paper of FIG. 3), heat sensitive circuit breakers 21a and 21b mounted on the first surface of the substrate 1, light-proof covers 22a and 22b covering the heat sensitive circuit breakers 21a and 21b to block light emitted from the light-emitting element 2 and travelling toward the heat sensitive circuit breakers 21a and 21b, and the heat dissipating member 5 formed on the second surface of the substrate 1 opposite to the first surface to dissipate heat of the substrate 1. In FIG. 3, illustrations of the light-proof covers 22a and 22b are omitted and contours thereof are shown by a dot-dash-line.

The heat sensitive circuit breakers 21a and 21b are respectively connected onto the metal films 3a and 3b. The heat sensitive circuit breakers 21a and 21b each have a conductive plate 211 in contact with the metal film 3a or 3b at both edges and having a convex portion between the both edges so as not to be in contact with the metal film 3a or 3b, fusible portions 212 for fixing the both edges of the conductive plate 211 to the metal film 3a or 3b, an elastic portion 213 formed of an elastic body such as spring or rubber held between the convex portion of the conductive plate 211 and the metal film 3a or 3b in a compressed state, and a contact pin 214 in contact with a portion of a bottom surface of the convex portion of the conductive plate 211. The conductive plate 211 electrically connects the contact pin 214 to the metal film 3a or 3b.

A lead wire 23a is connected to the contact pin 214 of the heat sensitive circuit breaker 21a. Likewise, a lead wire 23b is connected to the contact pin 214 of the heat sensitive circuit breaker 21b even though it is not illustrated.

The fusible portion 212 is formed of a material which melts at a predetermined temperature, such as low temperature solder material. As the low temperature solder material, it is possible to use, e.g., Sn-3.5Ag-0.5Bi-8In having a solidus temperature of 206° C. and a liquidus-line temperature of 217° C., Sn-58Bi having a solidus temperature of 139° C. and a liquidus-line temperature of 139° C., and Sn-58Bi-1Ag having a solidus temperature of 136° C. and a liquidus-line temperature of 138° C.

In the heat sensitive circuit breakers 21a and 21b, the fusible portion 212 is melted when the temperature thereof rises and exceeds the melting point and the conductive plate 211 then moves from the original position thereof due to an elastic force of the elastic portion 213, thereby interrupting electrical connection between the contact pin 214 and the metal film 3a or 3b. In this regard, there is no risk of generation of arc discharge at the fusible portion 212 since the connection between the conductive plate 211 and the metal film 3a or 3b is instantaneously interrupted by the elastic force of the elastic portion 213.

An electric current supplied from outside flows into the light-emitting device 20 through one of the lead wires 23a and 23b, is supplied to the light-emitting element 2 and then flows out through another of the lead wires 23a and 23b. Therefore, when the substrate 1 is overheated, the circuit is interrupted by melting of the fusible portion 212 of either the heat sensitive circuit breaker 21a or 21b and power supply to the light-emitting element 2 is cut. Accordingly, it is possible to improve reliability of the light-emitting device 20.

The light-emitting device 20 may have only one of the heat sensitive circuit breakers 21a and 21b. In addition, the layout of the light-emitting device 20 is not limited to that shown in FIG. 3 as long as the circuit for actuating the light-emitting element 2 is connected onto the first surface of the substrate 1.

The light-proof covers 22a and 22b block light emitted from the light-emitting element 2 and travelling toward the heat sensitive circuit breakers 21a and 21b, and accordingly, melting of the fusible portions 212 of the heat sensitive circuit breakers 21a and 21b caused by the light emitted from the light-emitting element 2 is prevented. The light-proof covers 22a and 22b can be formed of the same material as the light-proof covers 12a and 12b in the first embodiment.

Third Embodiment

The third embodiment is different from the first embodiment in the configuration of the heat sensitive circuit breaker. The explanation for the same features as the first embodiment will be omitted or simplified.

Figure 5:
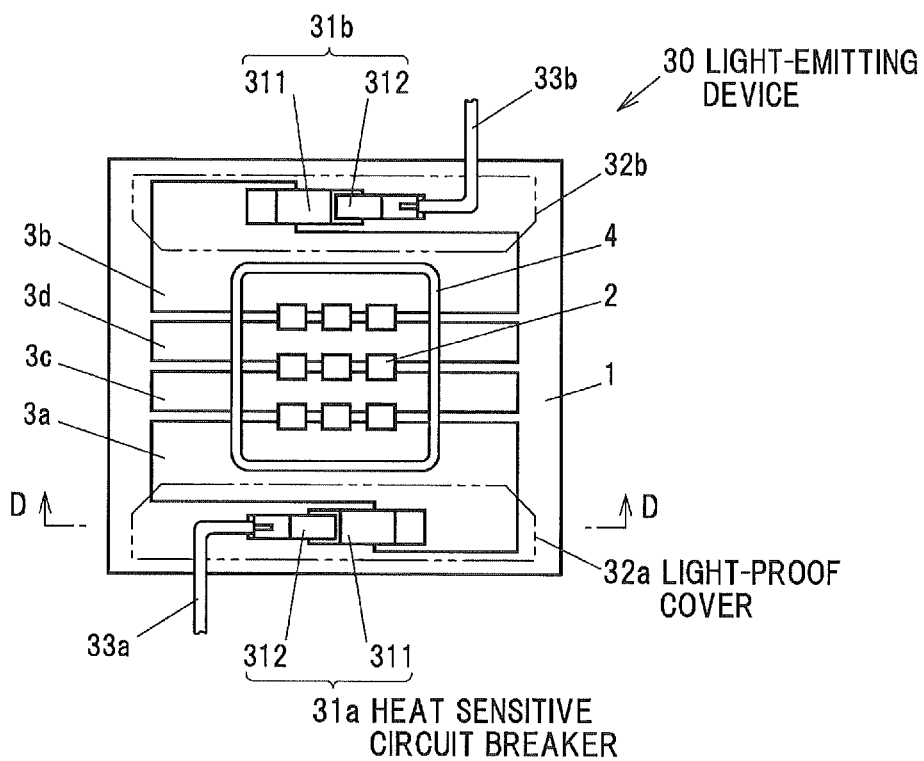
FIG. 5 is a top view showing a light-emitting device in a third embodiment.
Figure 6:
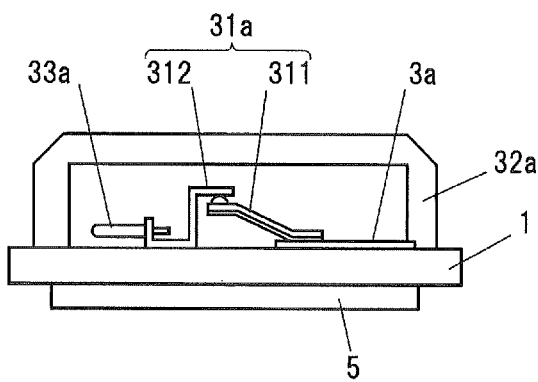
FIG. 6 is a vertical cross-sectional view showing the light-emitting device taken on line D-D of FIG. 5.

FIG. 5 is a top view showing a light-emitting device in a third embodiment. FIG. 6 is a vertical cross-sectional view showing the light-emitting device taken on line D-D of FIG. 5.

A light-emitting device 30 has the substrate 1, the light-emitting element 2 mounted on the first surface of the substrate 1 (on the front face side of the paper of FIG. 5), heat sensitive circuit breakers 31a and 31b mounted on the first surface of the substrate 1, light-proof covers 32a and 32b covering the heat sensitive circuit breakers 31a and 31b to block light emitted from the light-emitting element 2 and travelling toward the heat sensitive circuit breakers 31a and 31b, and the heat dissipating member 5 formed on the second surface of the substrate 1 opposite to the first surface to dissipate heat of the substrate 1. In FIG. 5, illustrations of the light-proof covers 32a and 32b are omitted and contours thereof are shown by a dot-dash-line.

The heat sensitive circuit breakers 31a and 31b each have a deformable member 311 formed of a conductive material which deforms in accordance with temperature variation, such as bimetal or shape-memory alloy, and an electrode 312. The deformable members 311 of the heat sensitive circuit breakers 31a and 31b are respectively connected to the metal films 3a and 3b. The electrodes 312 of the heat sensitive circuit breakers 31a and 31b are respectively connected to lead wires 33a and 33b.

In the heat sensitive circuit breakers 31a and 31b, the deformable member 311 is in contact with and is electrically connected to the electrode 312 under normal conditions, as shown in FIG. 6. The deformable member 311 deforms so as to separate from the electrode 312 when exceeding a predetermined temperature, and electrical connection between the deformable member 311 and the electrode 312 is thereby interrupted.

An electric current supplied from outside flows into the light-emitting device 30 through one of the lead wires 33a and 33b, is supplied to the light-emitting element 2 and then flows out through another of the lead wires 33a and 33b. Therefore, when the substrate 1 is overheated, the circuit is interrupted by deformation of the deformable member 311 of either the heat sensitive circuit breaker 31a or 31b and power supply to the light-emitting element 2 is cut. Accordingly, it is possible to improve reliability of the light-emitting device 30.

The light-emitting device 30 may have only one of the heat sensitive circuit breakers 31a and 31b. In addition, the layout of the light-emitting device 30 is not limited to that shown in FIG. 5 as long as the circuit for actuating the light-emitting element 2 is connected onto the first surface of the substrate 1.

The light-proof covers 32a and 32b block light emitted from the light-emitting element 2 and travelling toward the heat sensitive circuit breakers 31a and 31b, and accordingly, deformation of the deformable members 311 of the heat sensitive circuit breakers 31a and 31b caused by the light emitted from the light-emitting element 2 is prevented. The light-proof covers 32a and 32b can be formed of the same material as the light-proof covers 12a and 12b in the first embodiment.

Effects of the Embodiments

In the embodiments, since the heat sensitive circuit breaker is formed on the front surface of the substrate on which a light-emitting element is mounted, it is possible to place the heat dissipating member on the back surface having large area and thus to improve heat dissipation performance of the light-emitting device. In addition, since the heat sensitive circuit breaker is covered with the light-proof cover, the heat sensitive circuit breaker can block direct light from the light-emitting element so as to prevent interruption of the circuit.

The present invention is not intended to be limited to the above-mentioned embodiments, and the various kinds of modifications can be implemented without departing from the gist of the invention.

In addition, the invention according to claims is not to be limited to the above-mentioned embodiments. Further, please note that all combinations of the features described in the embodiments are not necessary to solve the problem of the invention.

What is claimed is:

1. A light-emitting device, comprising:
 a substrate comprising a metal film disposed on a first portion of a first surface thereof, the substrate including a second portion of the first surface being exposed;
 a light-emitting element mounted on the first surface of the substrate and connected to the metal film;
 a heat sensitive circuit breaker mounted on the first surface of the substrate and connected to the metal film, the heat sensitive circuit breaker directly contacting the second portion of the first surface of the substrate;
 a light-proof cover that covers the heat sensitive circuit breaker to block a light emitted from the light-emitting element and travelling toward the heat sensitive circuit breaker so as to prevent a thermal cutting of the heat sensitive circuit breaker caused by the light; and
 a heat dissipating member formed on a second surface of the substrate to dissipate heat of the substrate, the second surface being opposite to the first surface.

2. The light-emitting device according to claim 1, wherein the heat sensitive circuit breaker comprises a thermal fuse covered with the light-proof cover and connected to the metal film via a contact-type connector.

3. The light-emitting device according to claim 1, wherein the heat sensitive circuit breaker comprises:
- a conductive plate in contact with the metal film at both edges of the conductive plate and comprising a convex portion between the both edges so as not to be in contact with the metal film;
- fusible portions for fixing the both edges of the conductive plate to the metal film;
- an elastic portion held between the convex portion of the conductive plate and the metal film in a compressed state; and
- a contact pin in contact with a portion of a bottom surface of the convex portion of the conductive plate.

4. The light-emitting device according to claim 1, wherein the heat sensitive circuit breaker comprises a member that is formed of bimetal or shape-memory alloy and deforms in accordance with temperature variation, and an electrode that is in contact with the member before deformation of the member and is not in contact therewith after the deformation.

5. The light-emitting device according to claim 1, further comprising a reflector formed around the light-emitting element for reflecting light emitted from the light-emitting element.

6. The light-emitting device according to claim 5, wherein the reflector is situated between the light-emitting element and the light-proof cover.

7. The light-emitting device according to claim 5, wherein the reflector comprises a white silicone resin.

8. The light-emitting device according to claim 5, wherein the reflector comprises a same material as the light-proof cover.

9. A light-emitting device, comprising:
- a substrate having a first surface, a first portion of the substrate being exposed;
- a metal film disposed on a second portion of the first surface of the substrate;
- a light-emitting element mounted on the first surface of the substrate and connected to the metal film;
- a heat sensitive circuit breaker mounted on the first portion of the first surface of the substrate and connected to the metal film;
- a light-proof cover that covers the heat sensitive circuit breaker to block light emitted from the light-emitting element and travelling toward the heat sensitive circuit breaker; and
- a heat dissipating member formed on a second surface of the substrate to dissipate heat of the substrate, the second surface being opposite to the first surface.

10. The light-emitting device according to claim 9, wherein a portion of the substrate that surrounds the heat sensitive circuit breaker is exposed from the metal film.

11. The light-emitting device according to claim 9, wherein the metal film and the heat sensitive circuit breaker are disposed adjacent to each other on the first surface.

12. The light-emitting device according to claim 9, wherein the heat sensitive circuit breaker contacts the first surface of the substrate.

13. The light-emitting device according to claim 9, wherein the heat sensitive circuit breaker contacts the metal film.

14. The light-emitting device according to claim 9, wherein the heat sensitive circuit breaker comprises a conductive plate having a raised surface, a first surface, and a second surface,
- wherein the first surface and the second surface contact the metal film, and
- wherein the raised surface is disposed between the first surface and the second surface and in a different plane from the first surface and the second surface.

15. The light-emitting device according to claim 9, wherein the heat sensitive circuit breaker comprises a conductive plate having a raised surface, a first surface, and a second surface,
- wherein the raised surface is disposed in a different plane than the first surface and the second surface.

16. The light-emitting device according to claim 9, wherein the heat sensitive circuit breaker comprises a conductive plate having a raised surface, a first surface, and a second surface,
- wherein the raised surface is connected to the first surface by a connecting plate that is perpendicular to the first surface and the raised surface.

17. The light-emitting device according to claim 9, wherein the heat sensitive circuit breaker comprises a conductive plate having a raised surface, a first surface, and a second surface, the raised surface being disposed between the first surface and the second surface.

18. The light-emitting device according to claim 9, wherein the light-proof cover covers the heat sensitive circuit breaker so as to prevent a thermal cutting of the heat sensitive circuit breaker caused by the light.

\* \* \* \* \*